United States Patent [19]

Tanaka et al.

[11] Patent Number: 5,250,469
[45] Date of Patent: Oct. 5, 1993

[54] IC MOUNTING CIRCUIT SUBSTRATE AND PROCESS FOR MOUNTING THE IC

[75] Inventors: Yasuyuki Tanaka, Tsuchiura; Chikafumi Oomachi, Kashiwa, both of Japan

[73] Assignee: Nippon Mektron, Ltd., Tokyo, Japan

[21] Appl. No.: 776,340

[22] PCT Filed: May 22, 1991

[86] PCT No.: PCT/JP91/00680
§ 371 Date: Dec. 13, 1991
§ 102(e) Date: Dec. 13, 1991

[87] PCT Pub. No.: WO91/18415
PCT Pub. Date: Nov. 28, 1991

[30] Foreign Application Priority Data

May 24, 1990 [JP] Japan ................... 2-134783

[51] Int. Cl.5 ............................................. H01L 21/60
[52] U.S. Cl. ..................... 437/209; 437/183; 437/184; 437/203; 437/204; 437/216
[58] Field of Search ............... 437/209, 212, 213, 183, 437/184, 182, 203, 204, 216

[56] References Cited

U.S. PATENT DOCUMENTS

| | | | |
|---|---|---|---|
| 4,764,804 | 8/1988 | Sahara | 437/204 |
| 4,957,882 | 9/1990 | Shinomiya | 437/209 |
| 4,997,791 | 3/1991 | Ohuchi et al. | 437/209 |
| 5,071,787 | 12/1991 | Mori et al. | 437/209 |

FOREIGN PATENT DOCUMENTS

| | | | |
|---|---|---|---|
| 51-90568 | 8/1976 | Japan . | |
| 51106141 | 7/1982 | Japan . | |
| 3-291939 | 12/1991 | Japan | 437/183 |

Primary Examiner—Brian E. Hearn
Assistant Examiner—Kevin M. Picardat
Attorney, Agent, or Firm—Chilton, Alix & Van Kirk

[57] ABSTRACT

Herein disclosed is an IC mounting circuit substrate which comprises: a predetermined circuit conductor pattern formed on one face of an insulating layer; IC pad junctioning bumps junctioned electrically to predetermined portions of said circuit conductor pattern and projecting to the outside of a circuit substrate through said insulating layer; and a transparent insulating coating formed at the side of said circuit conductor pattern for transmitting an irradiation beam for heating and melting said bumps. As a fundamental process for mounting an IC on the IC mounting circuit substrate thus constructed, there is adopted a process for connecting the pads of said IC chip and said bumps electrically while heating and melting said bumps by the action of the irradiation beam supplied concentratedly from the side of said transparent insulating coating to said bump portions with said IC chip being arranged over said bumps.

12 Claims, 2 Drawing Sheets

IC MOUNTING CIRCUIT SUBSTRATE AND PROCESS FOR MOUNTING THE IC

TECHNICAL FIELD

The present invention relates to an IC mounting circuit substrate for connecting and mounting an IC chip with and on a circuit substrate and, more particularly, to an IC mounting circuit substrate and an IC mounting process for the circuit substrate, which are optimum if applied to a method of connecting bumps formed on a circuit substrate and pads of an IC chip electrically while being heated and melted by an irradiation energy emitted from an irradiation beam such as a laser beam or an infrared ray.

BACKGROUND ART

The well-known process for mounting an IC chip on a circuit substrate by using junctioning bumps is exemplified not only by the tab method of effecting the connections by the thermal fusion or ultrasonic bonding by using either the bumps formed on the IC chip at the side of the bonding pads or the bumps formed at the lead fingers at the side of a chip carrier tape but also by the flip-chip method of soldering the bumps formed at the side of the IC chip and the conductor pattern of the circuit substrate.

This process for mounting the IC chip on the circuit substrate is troubled by a high cost because the tab method requires a number of steps for the means for forming the bumps at the side of the IC chip. Thus, it is a tendency to adopt the method of transferring the bumps to the leading ends of the lead fingers. This method requires not only a special jig for forming the bumps but also a transfer bonding step and is limited in its high integration. Moreover, these two methods are suffered from a mechanical weakness because the lead fingers are not supported. Since, moreover, there is no insulator between those lead fingers, it is impossible to stagger the bonding pads. Still moreover, the lead fingers are liable to be deformed by their projecting structure, and it is difficult to hold the positional precision in the X, Y and Z directions.

Since, on the other hand, the bumps are likewise formed at the side of the IC chip in case of the flip chip method, a number of steps are required to raise the cost. This cost rise is also invited by forming a dam for preventing the solder from flowing to the peripheries of the pads of the circuit substrate. At the same time, a high integration is limited.

Therefore, the structure of the IC mounting circuit substrate, in which a predetermined circuit conductor pattern is formed on one face of an insulating film and in which IC pad junctioning bumps are made of solder such that they are electrically junctioned to the desired portions of the circuit conductor pattern and project to the outside of the circuit substrate through the aforementioned insulating layer, is highly practical as the means for solving the aforementioned several problems of the prior art. In order to mount the IC chip on that IC mounting circuit substrate, there is generally adopted a process for connecting and mounting the IC chip with and on the circuit substrate by melting solder bumps through a reflow furnace such that the pads of the IC chip are positioned over the bumps of the circuit substrate.

However, the method of connecting the IC chip by the reflow means of the solder bumps is troubled by the following problems: that the IC chip is damaged by the thermal impact at the time of passing the reflow furnace; and that the IC chip is also damaged due to the difference in thermal expansion between the circuit substrate and the IC chip.

DISCLOSURE OF THE INVENTION

In view of the background thus far described, the present invention contemplates to provide an IC mounting circuit substrate and an IC mounting process optimum for the former, which can mount an IC chip satisfactorily on the circuit substrate while being freed from affecting an IC chip adversely due to the thermal impacts or thermal stresses, when the IC chip is to be connected with and mounted on the IC mounting circuit substrate constructed to have IC pad junctioning bumps junctioned electrically to the predetermined portions of a predetermined circuit conductor pattern formed on one side of an insulating layer and projecting to the outside of the circuit substrate through the insulating layer.

According to the present invention, therefore, there is provided an IC mounting circuit substrate which comprises: a predetermined circuit conductor pattern formed on one face of an insulating layer; IC pad junctioning bumps junctioned electrically to predetermined portions of said circuit conductor pattern and projecting to the outside of a circuit substrate through said insulating layer; and a transparent insulating coating formed at the side of said circuit conductor pattern for transmitting an irradiation beam for heating and melting said bumps. Here, a shielding mask member can be formed on the outer face of said transparent insulating coating for shielding the regions other than the portions corresponding to the positions of said bumps. Said shielding mask member can be formed by evaporating a shielding member on the corresponding regions of said transparent insulating coating or can be made of a shielding member formed with holes at portions corresponding to the positions of said bumps and junctioned to the outer face of said transparent insulating coating.

As the process for connecting and mounting an IC chip with and to the aforementioned IC mounting circuit substrate, here can be adopted an IC mounting process which comprises the steps of: manufacturing an IC mounting circuit substrate by forming a predetermined circuit conductor pattern on one side of an insulating layer, by forming IC pad junctioning bumps junctioned electrically to predetermined portions in said circuit conductor pattern and projecting to the outside of a circuit substrate through said insulating layer, and by forming the side of said circuit conductor pattern with a transparent insulating coating for transmitting an irradiation beam for heating and melting said bumps; and connecting the pads of said IC chip and said bumps electrically while heating and melting said bumps by the action of the irradiation beam supplied concentratedly from the side of said transparent insulating coating to said bump portions with said IC chip being arranged over said bumps. In this process, the concentrated supply of the heating and melting irradiation beam to said bump portions can be performed either through a shielding mask member which is formed integrally with said IC mounting circuit substrate at the side of said transparent insulating coating or through a shielding mask member which is arranged and formed separately of said IC mounting circuit substrate at the side of said transparent insulating coating. Moreover, said shielding mask member formed on the excellently transparent substrate can be arranged on said IC mounting circuit substrate at the side of said transparent insulating coating.

Furthermore, the connections of said bumps and the pads of said IC chip can naturally be performed such that said IC chip is arranged on said bumps while being held by an IC holder and is preheated by said IC holder. In this case, said IC holder can be suitably given a function to position said IC chip with respect to said bumps.

BEST MODE FOR CARRYING OUT THE INVENTION

The present invention will be described in more detail in the following with reference to its embodiments with reference to the accompanying drawings.

Figure 1:
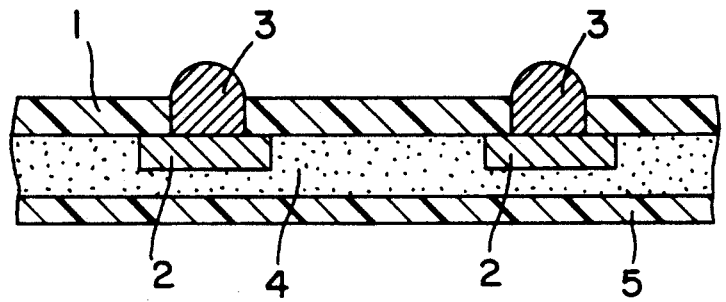
FIG. 1 is a conceptional section showing the structure of an essential portion of an IC mounting circuit substrate constructed according to one embodiment of the present invention.

FIG. 1 is a conceptional section showing an essential portion of an IC mounting circuit substrate constructed according to one embodiment of the present invention. In FIG. 1, reference numeral 1 designates a flexible insulating layer which is made of a suitable insulating resin film such as a polyimide film. This insulating layer 1 is formed on its back with a predetermined circuit conductor pattern 2 through an adhesive layer or not. In association with an IC chip to be mounted, as will be described hereinafter, the circuit conductor pattern 2 is formed at its predetermined portion with IC pad junctioning bumps 3, each of which is constructed to have its one end junctioned to said circuit conductor pattern 2 and its other end projecting to the outside of the circuit substrate through the insulating layer 1.

The circuit conductor pattern 2 to be formed on one face of the insulating layer 1 can be arbitrarily formed by applying the well-known photo-lithography to a flexible copper-plated laminated sheet having an adhesive layer or not. As a process for forming the IC pad junctioning bumps 3 integrally by a series of steps, there can be basically adopted a process comprising the steps of: preparing a non-adhesive flexible one-side conducting laminated sheet having no adhesive layer between the flexible insulating layer 1 and a conducting layer for the circuit conductor pattern 2; forming holes extending from the side of said insulating layer 1 to said conducting layer in the laminated sheet; forming the junctioning bumps 3 for the IC pad, each of which has its one end connected to said conducting layer and its other end projecting from said insulating layer 1, of a conducting member filling the holes by plating means; and patterning said conducting layer to form the predetermined circuit conductor pattern 2 in association with said junctioning bumps 3.

The IC pad junctioning bumps 3 can be likewise formed not only by using the aforementioned process of forming them on the single-layered circuit conductor pattern 2 but also by applying the aforementioned process to a multi-layered circuit substrate having two or more layers of such circuit conductor pattern. One process to be adopted for forming the aforementioned IC pad junctioning bumps 3 over such multi-layered circuit substrate comprises the steps of: preforming a predetermined circuit conductor pattern at first in an inner circuit conducting layer excepting the outer circuit conducting layer; forming conducting holes having their diameters gradually increasing in the inner and outer circuit conducting layers in such predetermined portions as are to establish mutual conductions of said circuit conducting layers; laminating and junctioning said inner and outer circuit conducting layers to each other in the presence of intervening insulating layers; forming holes, through which the conducting layer portions are exposed stepwise, by removing the insulating layers at corresponding portions to establish the mutual conductions of said conducting layers; forming inter-layer conducting members in said stepwise holes; subjecting a predetermined circuit conductor patterning treatment to said outer circuit conducting layer; and finally forming the IC pad junctioning bumps 3 over said inter-layer conducting members in a manner to project to the outside of said circuit substrate.

The IC pad junctioning bumps 3 thus constructed can be wholly made of such a member, e.g., solder as can be heated and melted by an irradiation energy such as a laser beam or an infrared ray so that the method of heating and melting the bumps 3 with the irradiation energy may be advantageously adopted as the connecting means with the IC chip, as will be described in the following. At least the semispherical projecting portions in the aforementioned bumps 3 can be partially made of similar solder so that they may be heated and melted by the aforementioned irradiation energy and connected in the desired manner with the IC chip.

The circuit conductor pattern 2 having such bumps 3 to be electrically junctioned to the pads of the IC chip has its outer face formed with a suitable insulating coating for protecting the same. In order to heat and melt the bumps 3 efficiently by the action of the aforementioned irradiation energy, it is preferable to form a suitable transparent insulating coating 5 such as a transparent polyimide film through a suitable adhesive 4 of an epoxy, acrylic or imide resin. Thanks to the structure having such transparent insulating coating 5, the bumps 3 can be heated and melted and can be electrically junctioned promptly with the pads of the IC chip by irradiating the portions of the bumps 3 locally and concentratedly from below the coating 5 with the irradiation light having a high thermal energy such as YAG laser, carbon dioxide gas laser or an infrared ray. For simplifying the heating and melting irradiation beam system, it is suitable to arrange the side of the transparent insulating coating 5 with a suitable shielding mask member 6, as shown in FIG. 2.

Figure 2:
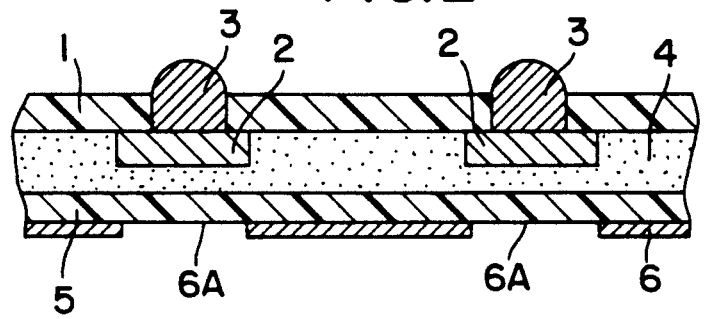
FIG. 2 is a conceptional section showing the structure of an essential portion of an IC mounting circuit substrate constructed to have a shielding mask member in accordance with another embodiment of the present invention.

Specifically, the shielding mask member 6 can be prepared, as shown in FIG. 2, by forming a shielding member of chromium, copper or aluminum either integrally by evaporation means at the face of the transparent insulating coating 5 other than irradiation openings 6A corresponding to the positions to be formed with the bumps 3 or through a stainless steel sheet in the holes at the corresponding portion in the aforementioned mode; and by adhering the shielding mask member 6 to the back of the transparent insulating coating 5 or simply in a separate state. Moreover, the process for arranging the mask member 6 on the outer face of the transparent insulating coating 5 can be replaced by a variety of processes of arranging the shielding mask member. As will be described hereinbefore, a shielding mask member 11 can be formed in the aforementioned mode over the surface of a satisfactory transparent substrate 12 of quartz or the like and arranged over the outer face of the transparent insulating coating 5.

Figure 3:
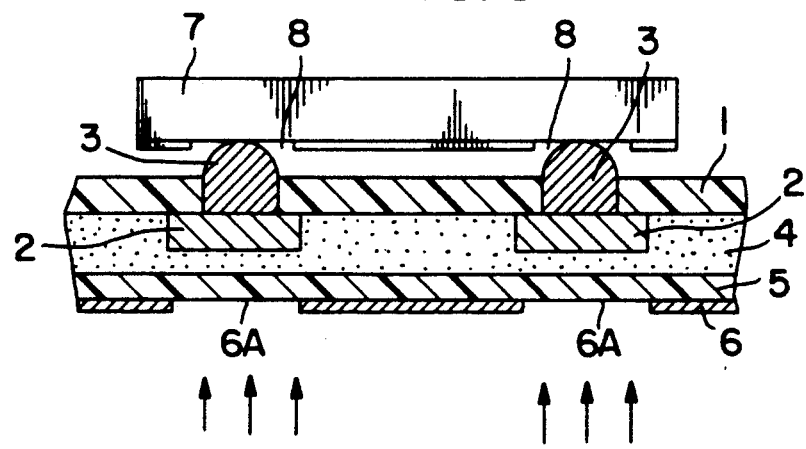
FIG. 3 is a diagram for explaining a mode of connecting and mounting an IC chip by using the circuit substrate.

In order to connect and mount the IC chip on the IC mounting circuit substrate arranged with the aforementioned shielding mask member 6, the pad 8 of an IC chip 7 is arranged on and in contact with the bump 3, as shown in FIG. 3, and is exposed from below the circuit substrate with an irradiation beam having a high thermal energy such as the YAG or carbon dioxide gas laser or the infrared ray. Since, however, the transparent insulating coating 5 has its back shielded by the shielding mask member 6 at portions of the bumps 3 from the irradiation openings 6A, the irradiation beam is concentrated on only the portions of the bumps 3 from the irradiation openings 6A. As a result, the IC chip 7 is freed from any damage due to the thermal influences so that the electric connections between the IC chip 7 and the electrode pads 8 can be excellently achieved with the heated and molted bumps 3 by the concentrated action of the thermal energy supplied from the irradiation openings 6A.

Figure 4:
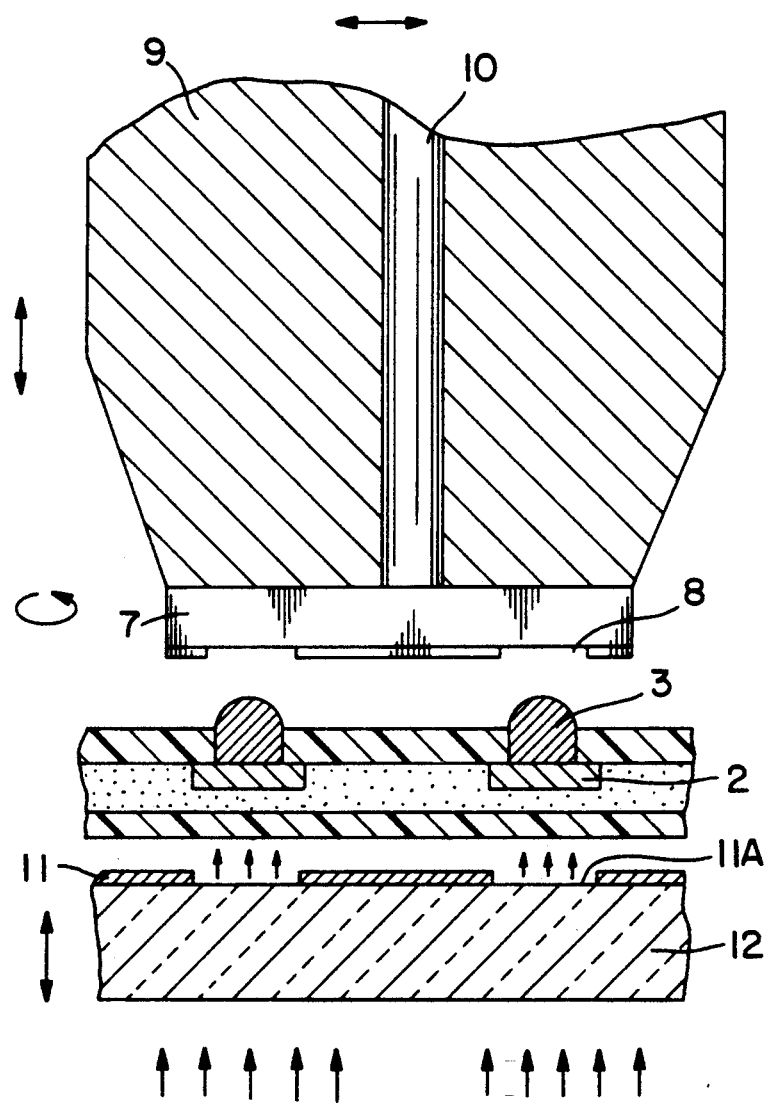
FIG. 4 is a diagram for explaining another process of mounting an IC by using shielding transparent means and an IC holder.

In another process for mounting the IC, as shown in FIG. 4, the circuit substrate is mounted and arranged on the shielding mask means which is formed with the aforementioned shielding mask member 11 over the excellently transparent another substrate 12 made of quartz or the like, and a vacuum suction holder 9 is used for the IC chip 7. In case of this mounting process, the IC chip to be mounted is held on the IC holder 9 by the suction of a vacuum suction hole 10 and is precisely moved over the bumps 3 of the circuit substrate in association with an image recognition system or the like so that the positioning of the electrode pads 8 and the bumps 3 is automatically processed while being properly preheated. As a result, the irradiation beam to be supplied from below the transparent substrate 12 is guided through irradiation openings 11A to heat and melt only the portions of the bumps 3 efficiently like the aforementioned mode so that the predetermined connections with the IC electrode pads 8 can be satisfactorily ended.

INDUSTRIAL APPLICABILITY

As has been described hereinbefore, according to the present invention, the IC mounting circuit substrate is constructed: by forming the IC pad junctioning bumps such that they are electrically junctioned to the predetermined portions in the circuit conductor pattern and project to the outside of the circuit substrate through the insulating layer supporting the circuit conductor pattern; and by forming the transparent insulating coating at the side of the circuit conductor pattern such that it can be arranged with the mask means for transmitting the irradiation beam for heating and melting the aforementioned bumps. Thus, the bumps of the circuit substrate and the pads of the IC chip can be connected with each other with excellent electric and mechanical characteristics without thermally damaging the IC chip undersirably, by the IC mounting process for connecting the pads of the IC chip and the bumps electrically while heating and melting the bumps by the action of the irradiation beam applied concentratedly to the bump portions from the side of the transparent insulating coating such that the IC chip is arranged on the bumps of the circuit substrate.

Thanks to the method of heating the connected portions locally and concentratedly with the irradiation beam, the IC chip can be optimumly mounted on the circuit substrate without establishing the undesirable thermal stress in neither the circuit substrate nor the IC chip.

Since this method of mounting the IC chip on the circuit substrate is not the bump heating and melting connections of reflow type but the local and concentrated heating and melting method for the bump portions necessary for the mutual connections, the thermal energy efficiency is remarkably excellent, and the system structure can be realized in a small size and at a low cost.

We claim:

1. An IC mounting circuit substrate comprising: a predetermined circuit conductor pattern formed on a first face of an insulating layer; IC pad junctioning bumps electrically connected to predetermined portions of said circuit conductor pattern, said bumps extending through said insulating layer and projecting outwardly from a second face of the circuit substrate, the second face being disposed oppositely with respect to the first face; an insulating coating on the side of said circuit conductor pattern, said coating being transparent to an irradiation beam whereby said beam may be transmitted through said coating for heating and melting said bumps; and a shielding mask member formed on the outwardly facing side of said transparent insulating coating for shielding portions of said insulating layer first face other than the portions corresponding to the positions of said bumps.

2. An IC mounting circuit substrate according to claim 1 wherein said shielding mask member is formed by depositing a shielding coating on said transparent insulating coating.

3. An IC mounting circuit substrate according to claim 1 wherein said shielding mask member is comprised of a shielding member having holes at positions corresponding to the positions of said bumps, said member being affixed to said transparent insulating coating.

4. An IC mounting process comprising the steps of: manufacturing an IC mounting circuit substrate by forming a predetermined circuit conductor pattern on a first side of an insulating layer, forming electrically conductive IC pad junctioning bumps electrically connected to predetermined portions of circuit conductor pattern and projecting through said insulating layer and extending outwardly from a second side of said insulating layer which is disposed oppositely with respect to said first side, and forming an insulating coating which is transparent to an irradiation beam over said conductor pattern whereby a said irradiation beam may be transmitted through said coating for heating and melting said bumps; providing a shielding mask member over said transparent insulating coating, said shielding mask member being provided with openings through which a said irradiation beam may pass, said openings of said shielding mask member being in registration with said bumps; and causing the contact pads of an IC chip to contact said bumps on said first side of said insulating layer while heating and melting said bumps by the action of a said irradiation beam supplied concentratedly from the side of said transparent insulating coating to said bumps through said shielding mask member openings whereby the IC chip contact pads will be electrically connected to said conductor pattern through said bumps.

5. An IC mounting process according to claim 4 wherein the heating and melting of said bumps is performed through a shielding mask member which is formed separately of said IC mounting circuit substrate and arranged at the exposed side of said transparent insulating coating.

6. An IC mounting process accordingly to claim 4 wherein said shielding mask member is formed on the exposed side of said transparent insulating coating and is thus integral with said mounting circuit substrate.

7. An IC mounting process according to claim 4 wherein the the step of causing the contact pads of an IC chip to contact said bumps includes mounting the said IC chip in a IC holder and said mounting process further comprises preheating said bumps through said IC holder.

8. An IC mounting process according to claim 7 wherein said IC holder positions said IC chip with respect to said bumps.

9. An IC mounting process according to claim 6 wherein the the step of causing the contact pads of an IC chip to contact said bumps includes mounting the said IC chip in a IC holder and said mounting process further comprises preheating said bumps by said IC holder.

10. An IC mounting process according to claim 7 wherein the the step of closing the contact pads of an IC chip to contact said bumps includes mounting the said IC chip in a IC holder and said mounting process further comprises preheating said bumps through said IC holder.

11. An IC mounting process according to claim 9 wherein said IC holder positions said IC chip with respect to said bumps.

12. An IC mounting process according to claim 10 wherein said IC holder positions said IC chip with respect to said bumps.

* * * * *

UNITED STATES PATENT AND TRADEMARK OFFICE
CERTIFICATE OF CORRECTION

PATENT NO. : 5,250,469
DATED : October 5, 1993
INVENTOR(S) : Yasuyuki Tanaka and Chikafumi Oomachi It is certified that error appears in the above-indentified patent and that said Letters Patent is hereby corrected as shown below:

In column 5, line 2, "portion" should read --portions--; line 23, delete "of the bumps 3 from" and insert in place thereof --excepting--.

In column 7, line 15, "accordingly" should read --according--.

In column 8, line 7, delete "the" (second occurrence); line 13, delete "the" (second occurrence); change "closing" to --causing--.

Signed and Sealed this

Twenty-third Day of January, 1996

Attest:

BRUCE LEHMAN

Attesting Officer

Commissioner of Patents and Trademarks